(12) United States Patent
Sakui et al.

(10) Patent No.: US 7,694,066 B2
(45) Date of Patent: Apr. 6, 2010

(54) NONVOLATILE MEMORY WITH ACTIVE AND PASSIVE WEAR LEVELING

(75) Inventors: Koji Sakui, Tokyo (JP); Kazuhiro Suzuki, Kanagawa (JP); Daisuke Yoshioka, Kanagawa (JP); Kazuto Kamimura, Kanagawa (JP); Takeshi Ishimoto, Tokyo (JP); Jun Sumino, Kanagawa (JP)

(73) Assignee: Sony Corporation, Tokyo (JP)

( * ) Notice: Subject to any disclaimer, the term of this patent is extended or adjusted under 35 U.S.C. 154(b) by 627 days.

(21) Appl. No.: 11/594,082

(22) Filed: Nov. 8, 2006

(65) Prior Publication Data

US 2007/0103992 A1    May 10, 2007

(30) Foreign Application Priority Data

Nov. 10, 2005    (JP)    .............. P2005-326414

(51) Int. Cl.
    *G06F 13/00*    (2006.01)
(52) U.S. Cl. ................ 711/103; 711/159; 711/165
(58) Field of Classification Search ............... 711/103, 711/159, 165
    See application file for complete search history.

(56) References Cited

U.S. PATENT DOCUMENTS

| | | | |
|---|---|---|---|
| 5,519,843 A | 5/1996 | Moran et al. | |
| 5,602,987 A | 2/1997 | Harari et al. | |
| 5,907,856 A | 5/1999 | Estakhri et al. | |
| 6,230,233 B1* | 5/2001 | Lofgren et al. | ............ 711/103 |
| 6,594,183 B1 | 7/2003 | Lofgren et al. | |
| 6,831,865 B2* | 12/2004 | Chang et al. | ........... 365/185.33 |
| 2004/0059906 A1* | 3/2004 | Park et al. | ................ 713/2 |
| 2006/0026340 A1* | 2/2006 | Ito et al. | .................. 711/103 |

OTHER PUBLICATIONS

Dmitry Shmidt, TrueFFS Wear-Leveling Mechanism, Technical Note (TN-DOC-017), M-Systems Flash Disk Pioneers, May 20, 2002, retreived from internet Apr. 24, 2009 [url: www.dataio.com/pdf/NAND/MSystems/TrueFFS_Wear_Leveling_Mechanism.pdf ], pp. 1-4.*
K.-D. Suh et al., "A 3.3V 32 Mb NAND Flash Memory with Incremental Step Pulse Programming Scheme", IEEE Journal of Solid-State Circuits, vol. 30., No. 11, Nov. 1995.
Y. Iwata et al., "A 35ns Cycle Time 3.3 V Only 32 Mb NAND Flash EEPROM", IEEE Journal of Solid-State Circuits, vol. 30., No. 11, Nov. 1995.

* cited by examiner

*Primary Examiner*—Christian P Chace
*Assistant Examiner*—Jared I Rutz
(74) *Attorney, Agent, or Firm*—Rader, Fishman & Grauer PLLC

(57) ABSTRACT

A memory system including a nonvolatile semiconductor storage device includes: a nonvolatile memory unit that includes a first data area in which data is frequently rewritten and a second data area in which data is hardly rewritten; and a control unit. The control unit sequentially selects logical block addresses in the second data area in which data is hardly rewritten and updates physical block addresses at new rewriting destinations in the first data area in which data is frequently rewritten to physical block addresses corresponding to the logical block addresses selected.

11 Claims, 18 Drawing Sheets

BLOCKS HARDLY REWRITTEN
REW BLK

WBLK
BLOCKS FREQUENTLY REWRITTEN

PHYSICAL BLOCK ADDRESS PA

FIG. 9

LOGICAL BLOCK ADDRESS
BLOCKS HARDLY REWRITTEN

REW BLK

112

LA1 *   *   *   *

111

WBLK

BLOCKS FREQUENTLY REWRITTEN

NONVOLATILE MEMORY WITH ACTIVE AND PASSIVE WEAR LEVELING

CROSS-REFERENCES TO RELATED APPLICATIONS

This application contains subject matter related to Japanese Patent Application JP 2005-326414 filed in the Japanese Patent Office on Nov. 10, 2005, the entire contents of which being incorporated herein by reference.

BACKGROUND OF THE INVENTION

1. Field of the Invention The present invention relates to a memory system including a nonvolatile semiconductor storage device, and, more particularly to a technique for improving a Wear-leveling control system in a memory system having a data area in which data is frequently rewritten and a data area hardly written mixed therein.

2. Description of the Related Art

As one of semiconductor storage devices, a flash memory that can be electrically written is known. Above all, a NAND flash memory in which plural memory cells are connected in series to constitute a NAND cell block attracts attention as a flash memory that can be highly integrated.

One memory cell of the NAND flash memory has a FET-MOS structure in which a floating gate (a charge storage layer) and a control gate are stacked on a semiconductor substrate via an insulating film. The plural memory cells are connected and constitute NAND cells in series such that sources and drains are shared among the memory cells adjacent to one another. Such NAND cells are arrayed in matrix to constitute a memory cell array.

The drains at one end side of the NAND cells arranged in a column direction of the memory cell array are commonly connected to a bit line via selection gate transistors, respectively. The sources on the other end side are also commonly connected to a source line via selection gate transistors. Word lines of memory cell transistors and gate electrodes of the selection gate transistors are commonly connected in a row direction of the memory cell array as a word line (a control gate line) and a selection gate line, respectively.

Such a NAND flash memory is disclosed in, for example, K.-D. Suh et al., "A 3.3V 32Mb NAND Flash Memory with Incremental Step Pulse Programming Scheme," IEEE J. Solid-State Circuits, vol. 30, pp. 1149-1156, November 1995 and Y. Iwata et al., "A 35ns Cycle Time 3.3V Only 32 Mb NAND Flash EEPROM," IEEE J. Solid-State Circuits, vol. 30, pp. 1157-1164, November 1995.

FIG. 1 is a diagram showing a block and page arrangement of a binary 2-Gbit NAND flash memory.

As shown in FIG. 1, a 2-Gbit chip includes 2048 blocks BLK of 128 KB and is constituted by 2 Gb=256 MB=128 KB×2048. Each of blocks BLK0 to BLK2047 includes 64 pages of 2 KB and is constituted by 128 KB=2 KB×64.

As a system including the NAND flash memory described above, for example, systems disclosed in E. Harari et al., "Flash EEPROM System," U.S. Pat. No. 5,602,987, Feb. 11, 1997, P. Estakhri et al., "Moving Sectors Within A Block OF Information In A Flash Memory Mass Storage Architecture," U.S. Pat. No. 5, 907,856, May 25, 1999, and D. Moran et al., "Flash Memory System Providing Both Bios and User Storage Capability," U.S. Pat. No. 5,519,843, May 21, 1996 are known.

In a memory system including a flash memory, Wear-leveling control is performed to prevent rewriting from being concentrated in a specific physical address block.

In the flash memory, in rewriting stored data, the stored data has to be erased before writing. An old block that has already become unnecessary is erased in advance, new data is written in the block erased, and a logical block address of the block is updated.

On the other hand, it is said that a life in terms of the number of times of rewriting of the NAND flash memory is 0.3 to $1 \times 10^6$ times for a binary product that stores 1-bit data in one memory cell.

Therefore, it is an object of the Wear-leveling control to perform control to prevent rewriting from being concentrated in a block of a specific physical address.

There are roughly two kinds of systems in the Wear-leveling control: Passive-wear-leveling and Active-wear-leveling.

In the Passive-wear-leveling, a block of a physical address not to be rewritten is left as it is and, in rewriting only a block of a physical address to be rewritten, the block is replaced with a block of an arbitrary physical address erased such that the Wear-leveling control can be automatically performed. In the Active-wear-leveling, rewriting is performed in blocks of all physical addresses including a block of a physical address not to be rewritten such that numbers of times of rewriting are averaged.

The Active-wear-leveling is disclosed in, for example, K. M. J. Lofgren et al., "Wear Leveling Techniques for Flash EEPROM Systems," U.S. Pat. No. 6,594,183 B1, Jul. 15, 2003.

SUMMARY OF THE INVENTION

In K. M. J. Lofgren et al., there is a definition "In a nonvolatile memory system in which non-uniformity of the number of times of rewriting occurs while rewriting is repeated, with the nonvolatile memory system divided into plural memory cell groups erasable together, a first logical address and data are received from a host, the first logical address is converted into a first physical address, and the data is written in the first physical address. When second data and the first logical address are received from a host, if a first erase unit exceeds the number of times of rewriting defined in advance, the first logical address is converted into a second physical address of a different memory cell group."

Therefore, in the Active-wear-leveling control, rewriting is evenly performed in a block that does not have to be rewritten as well. As a result, rewriting may be performed a large number of times unnecessarily.

FIGS. 2 and 3 are diagrams showing examples of actual use of the NAND flash memory. In the example shown in FIG. 2, most of blocks of a NAND flash memory capacity are occupied by blocks WBLK in which data is frequently rewritten. Conversely, in the example shown in FIG. 3, most of blocks of a NAND flash memory capacity are occupied by blocks REWBLK in which data is hardly rewritten.

In the case of FIG. 2, if the Active-wear-leveling control is performed, regardless of the fact that most of the blocks are frequently rewritten to automatically perform the wear-leveling control, unnecessary rewriting is further performed in order to average the numbers of times of rewriting in all the blocks. As a result, all the blocks reach the limit of the number of times of rewriting at an early stage.

On the other hand, in the case of FIG. 3, if the Passive-wear-leveling control is performed, wear-leveling is automatically applied to a few blocks frequently rewritten. These blocks immediately reach the limit of the number of times of rewriting.

Therefore, it can be said that, in the case of FIG. 2, the Passive-wear-leveling control is most suitable and, in the case of FIG. 3, the Active-wear-leveling control is most suitable.

In FIG. 4, for example, there are 2048 blocks and some of the blocks are erased blocks ERDBLK.

In this case, in rewriting data, first, an erased block ERDBLK is searched for in the blocks. However, the erased block ERDBLK is searched for in the blocks in an order from a block with a smallest address of a physical block. Thus, there is an inconvenience in that, inevitably, rewriting is concentrated in blocks with small addresses of physical blocks and the number of times of rewriting increases.

Thus, it is desirable to provide a memory system that makes it possible to typically perform optimum Wear-leveling control even when data having a data area in which data is frequently rewritten and a data area in which data is hardly rewritten mixed therein is stored and makes it possible to substantially improve an effective life in terms of the number of times of rewriting of the system.

According to a first embodiment of the invention, there is provided a memory system including a nonvolatile semiconductor storage device. The memory system has a nonvolatile memory unit that includes a first data area in which data is frequently rewritten and a second data area in which data is hardly rewritten and a control unit. The control unit sequentially selects logical block addresses in the second data area in which data is hardly rewritten and updates physical block addresses at new rewriting destinations in the first data area in which data is frequently rewritten to physical block addresses corresponding to the logical block. addresses selected.

Preferably, the control unit copies data stored in a logical block address in the second data area in which data is hardly rewritten to an erased block and, then, erases a block at a copy source.

Preferably, the control unit provides identification flags in at least one of logical block addresses that store data hardly rewritten and the logical block addresses that store data frequently rewritten.

Preferably, the control unit immediately writes, after erasing a logical block address, the erased logical block address in an erased block and sequentially rewrites blocks to be rewritten in accordance with the erased logical block address.

According to a second embodiment of the invention, there is provided a memory system including a nonvolatile semiconductor storage device. The memory system has a nonvolatile memory unit that includes a first data area in which data is frequently rewritten and a second data area in which data is hardly rewritten and a control unit that sequentially selects logical block addresses in the second data area in which data is hardly rewritten and updates physical block addresses at new rewriting destinations in the first data area in which data is frequently rewritten to physical block addresses corresponding to the logical block addresses selected. The control unit is capable of performing, in performing Wear-leveling control for preventing rewriting from being concentrated in a specific physical address block, Passive-wear-leveling control for leaving a physical address block not rewritten as it is and Active-wear-leveling control for rewriting even a physical address block not rewritten such that the numbers of times of rewriting of all physical address blocks are averaged. System selection for the Passive-wear-leveling control and the Active-wear-leveling control or condition setting values of both the kinds of Wear-leveling are stored in the nonvolatile memory unit.

Preferably, the control unit selects, when data not frequently rewritten is stored in more than half blocks of the nonvolatile memory unit, the Active-wear-leveling control system and selects, when data frequently rewritten is stored in more than half blocks of the nonvolatile memory unit, the Passive-wear-leveling control system.

Preferably, the memory system has a page buffer. The system selection for the Passive-wear-leveling control and the Active-wear-leveling control or the condition setting values of both the kinds of Wear-leveling are stored in a first page of the nonvolatile memory unit and automatically read out to the page buffer when a power supply is turned on.

Preferably, it is possible to arbitrarily set the system selection for the Passive-wear-leveling control and the Active-wear-leveling control and the condition setting values of both the kinds of Wear-leveling.

According to the embodiments of the invention, it is possible to perform optimum Wear-leveling control even when data having the first data area in which data is frequently rewritten and the second data area in which data is hardly rewritten mixed therein is stored, and it is possible to substantially improve an effective life in terms of the number of times of rewriting by the memory system in which the nonvolatile semiconductor storage device is used.

Since the number of times of rewriting of the memory system is increased, it goes without saying that a more reliable system can be provided. Moreover, the extension of the life in terms of the number of times of rewriting leads to a reduction in cost of the system.

BRIEF DESCRIPTION OF THE DRAWINGS

In the accompanying drawings:

FIG. 9 is a diagram showing an example in which the flags * are provided in logical block addresses LA1 having stored therein data frequently rewritten;

DESCRIPTION OF THE PREFERRED EMBODIMENTS

An embodiment of the invention will be hereinafter explained with reference to the drawings.

Figure 1:
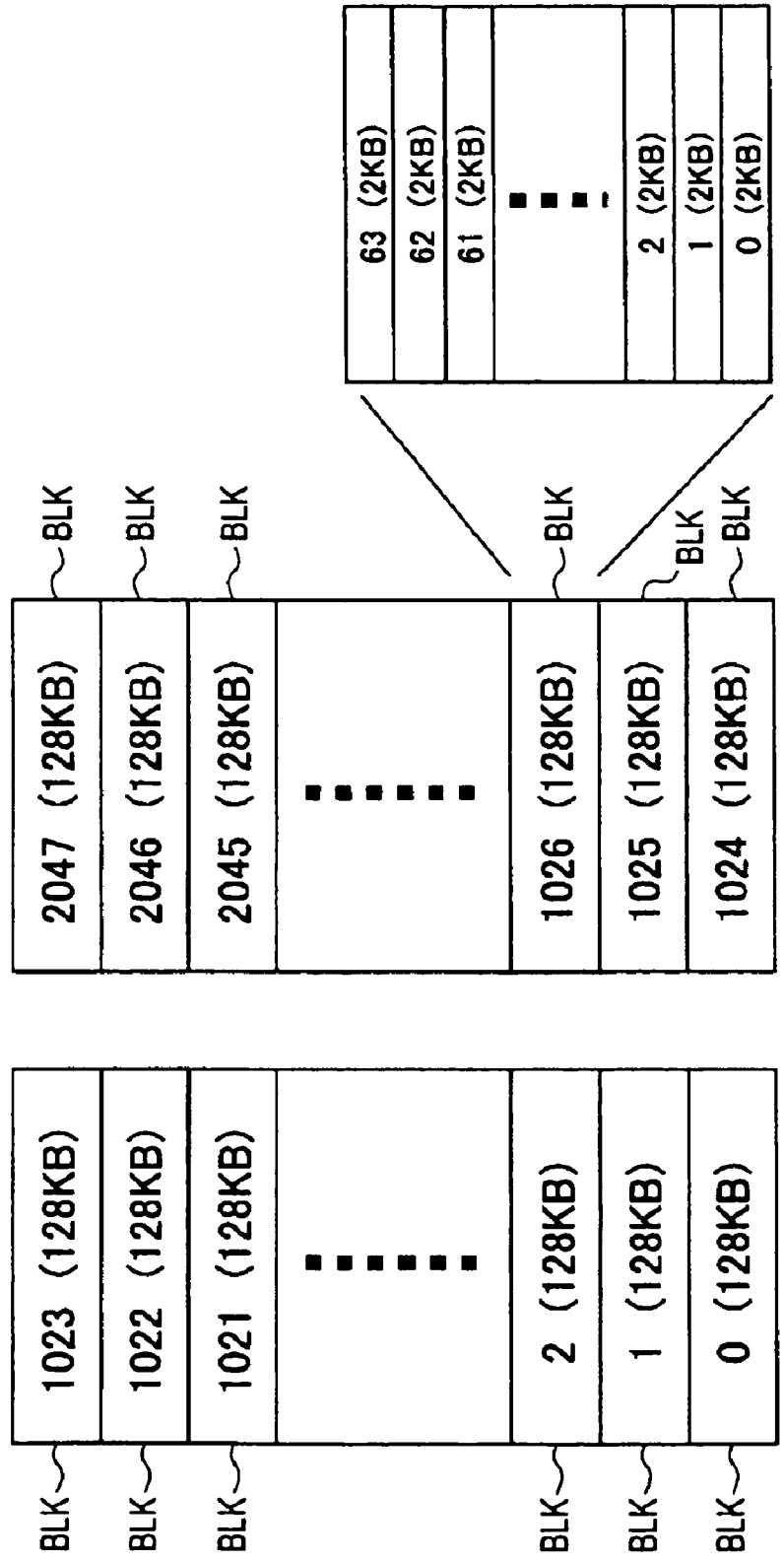
FIG. 1 is a diagram showing an example of a block and page arrangement of a general binary 2-Gbit NAND flash memory.
Figure 2:
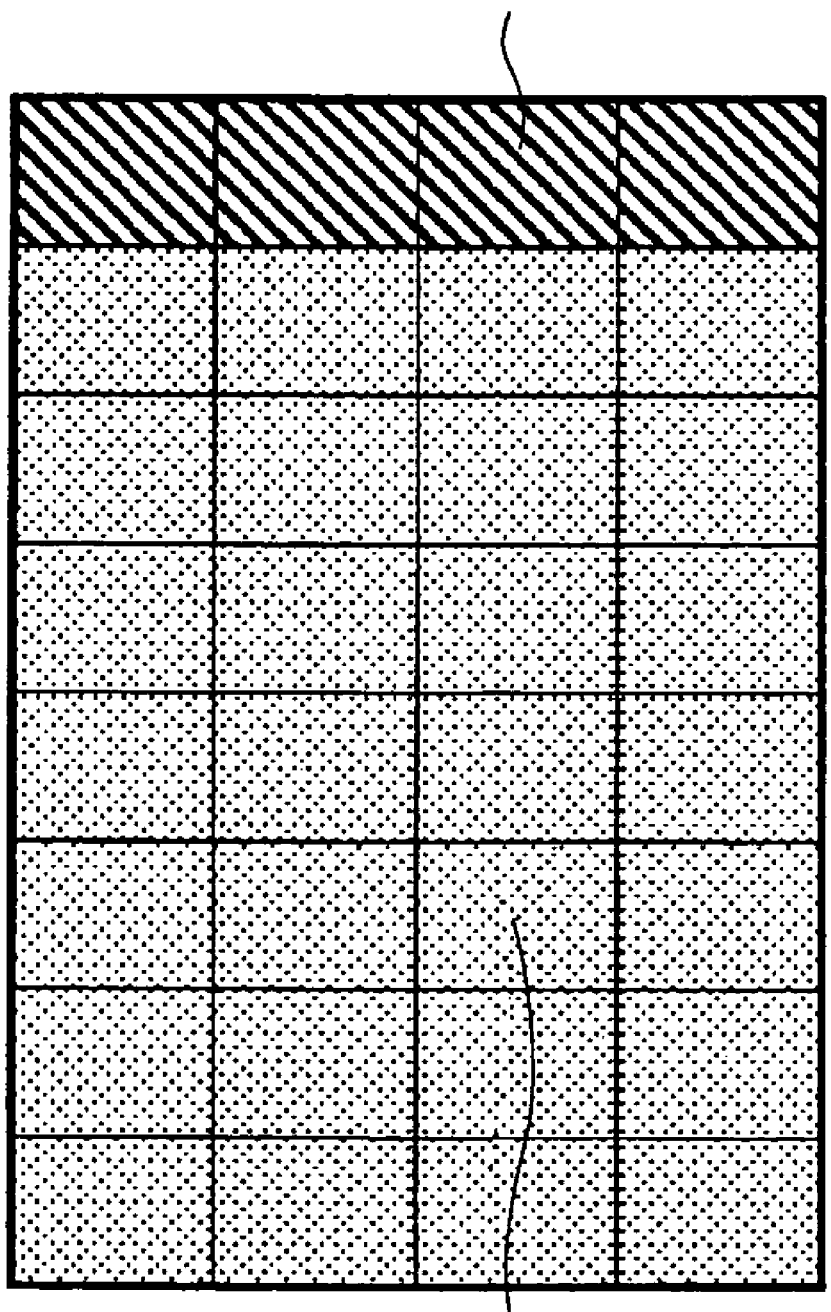
FIG. 2 is a diagram showing an example of actual use of the NAND flash memory, wherein most of blocks of a NAND flash memory capacity are occupied by blocks in which data is frequently rewritten.
Figure 3:
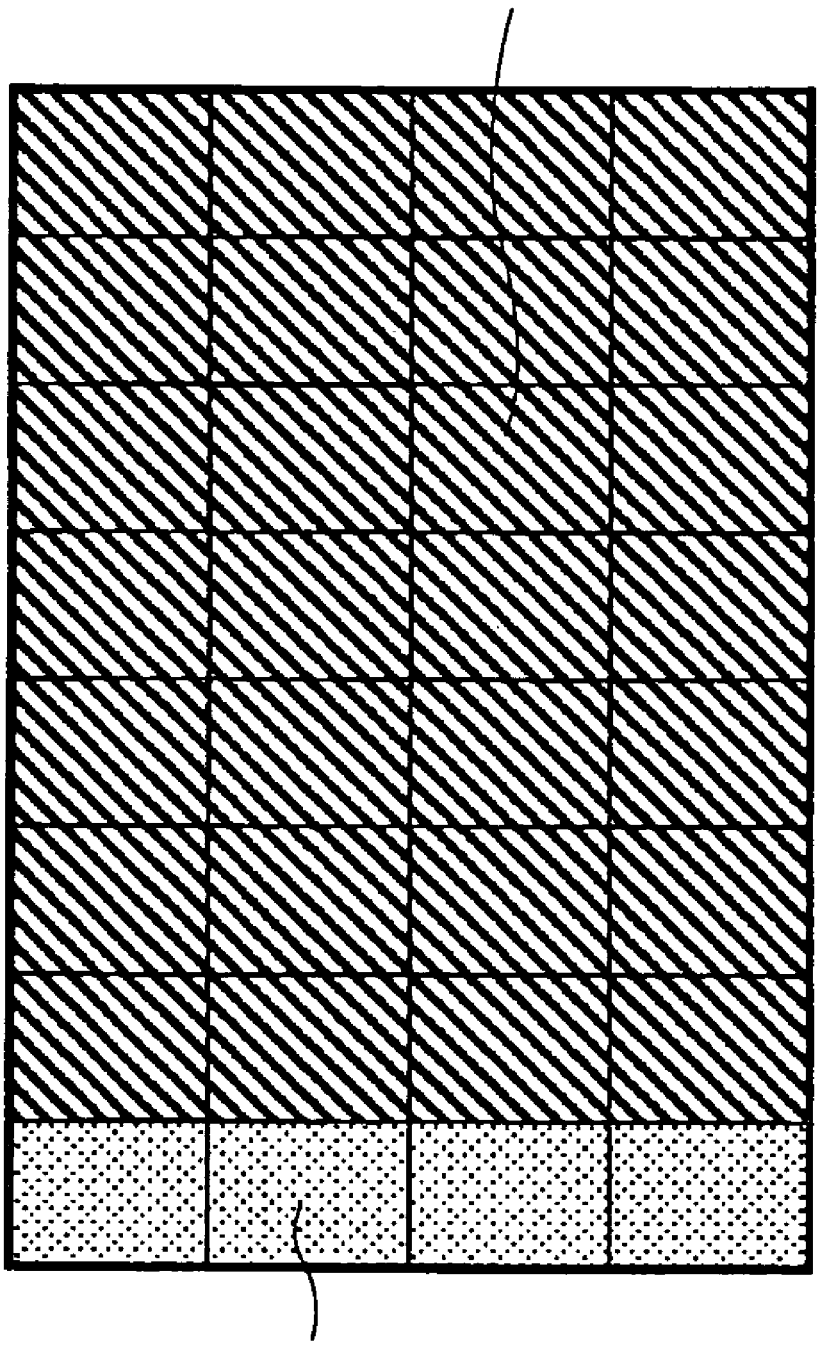
FIG. 3 is a diagram showing an example of actual use of the NAND flash memory, wherein most of blocks of a NAND flash memory capacity are occupied by blocks in which data is hardly rewritten.
Figure 4:
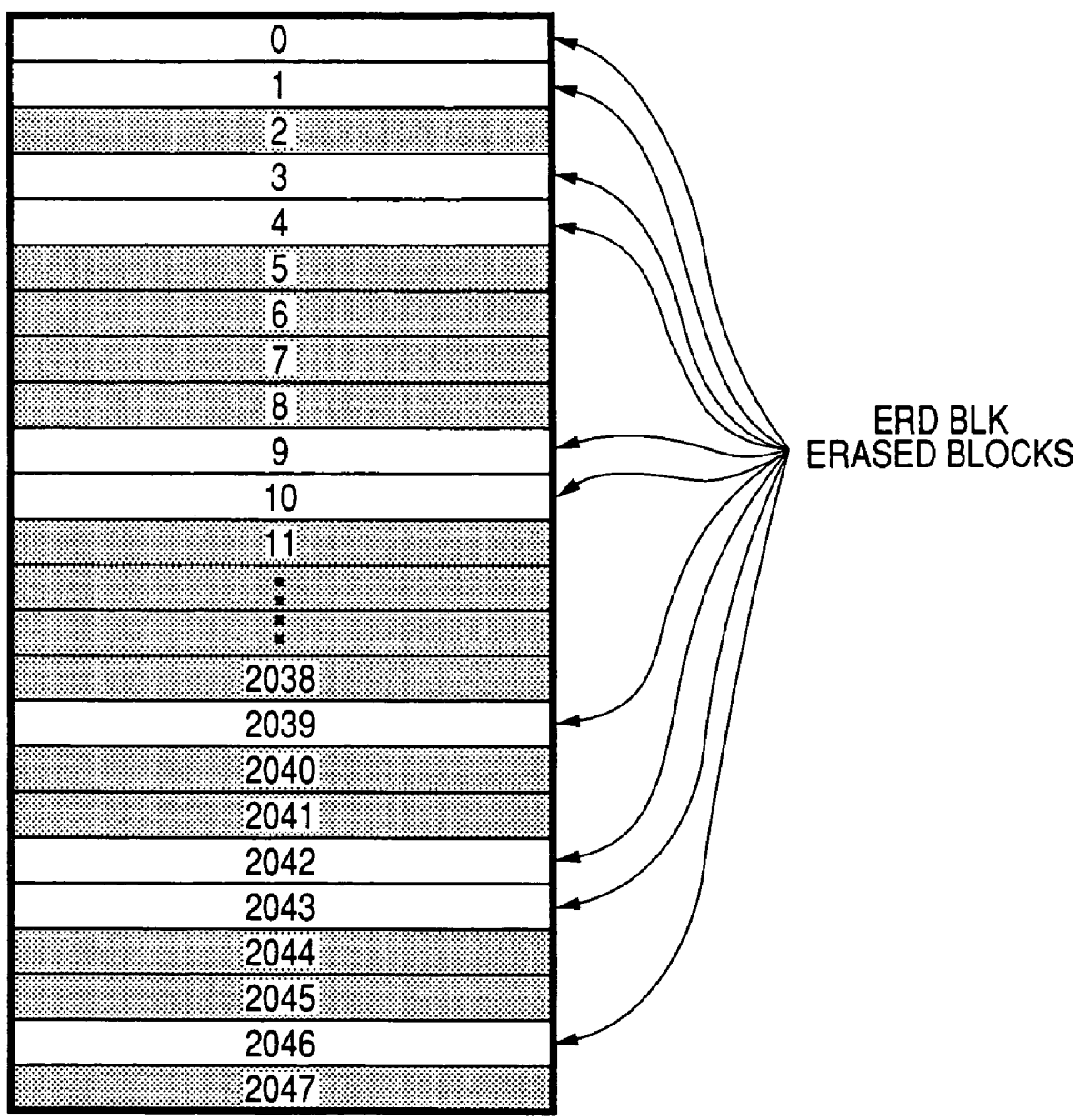
FIG. 4 is a diagram showing an example of erased blocks in a general flash memory.
Figure 5:
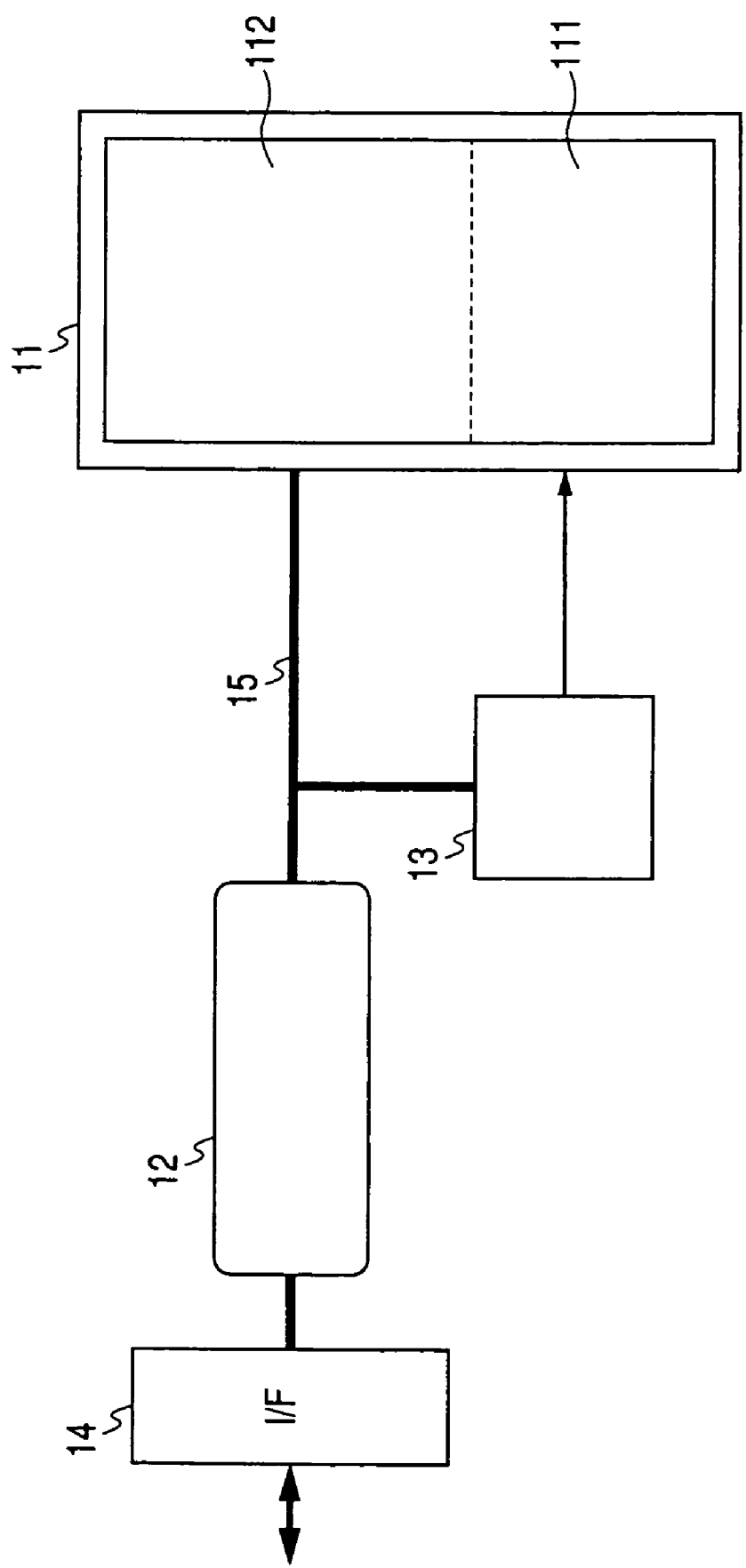
FIG. 5 is a diagram showing a memory system (a storage) according to an embodiment of the invention.

FIG. 5 is a diagram showing a memory system (a storage) according to the embodiment of the invention.

A memory system (a storage) 10 in FIG. 5 has, as main components, a NAND flash memory 11 serving as a nonvolatile memory unit, a page buffer 12, a control unit 13, an interface circuit (I/F) 14, and an internal data bus 15.

In the memory system 10, a one-chip NAND flash memory 11, which has, for example, a 16-bit input/output, is connected in parallel to the internal data bus 15.

The page buffer 12 temporarily stores, via the internal data bus 15, page data accessed. The page buffer 12 is connected to the interface circuit 14 with the outside.

The control unit 13 performs control of access to the flash memory 11 on the basis of an improved Wear-leveling control system. As explained later, the control unit 13 typically realizes optimum Wear-leveling control even when data having a first data area in which data is frequently rewritten and a second data area in which data is hardly rewritten in the flash memory 11 mixed therein is stored.

The NAND flash memory 11 according to this embodiment has a first data area 111 in which data is frequently rewritten and a second data area 112 in which data is hardly rewritten.

In the flash memory 11, logical block addresses (LA: LOGICAL ADDRESS) in the second data area in which data is hardly rewritten are sequentially selected and physical block addresses (PA: PHYSICAL ADDRESS) at new rewriting destinations in the data area in which data is frequently rewritten are updated to physical block addresses PA corresponding to the logical block addresses LA by the control unit 13.

Figure 6:
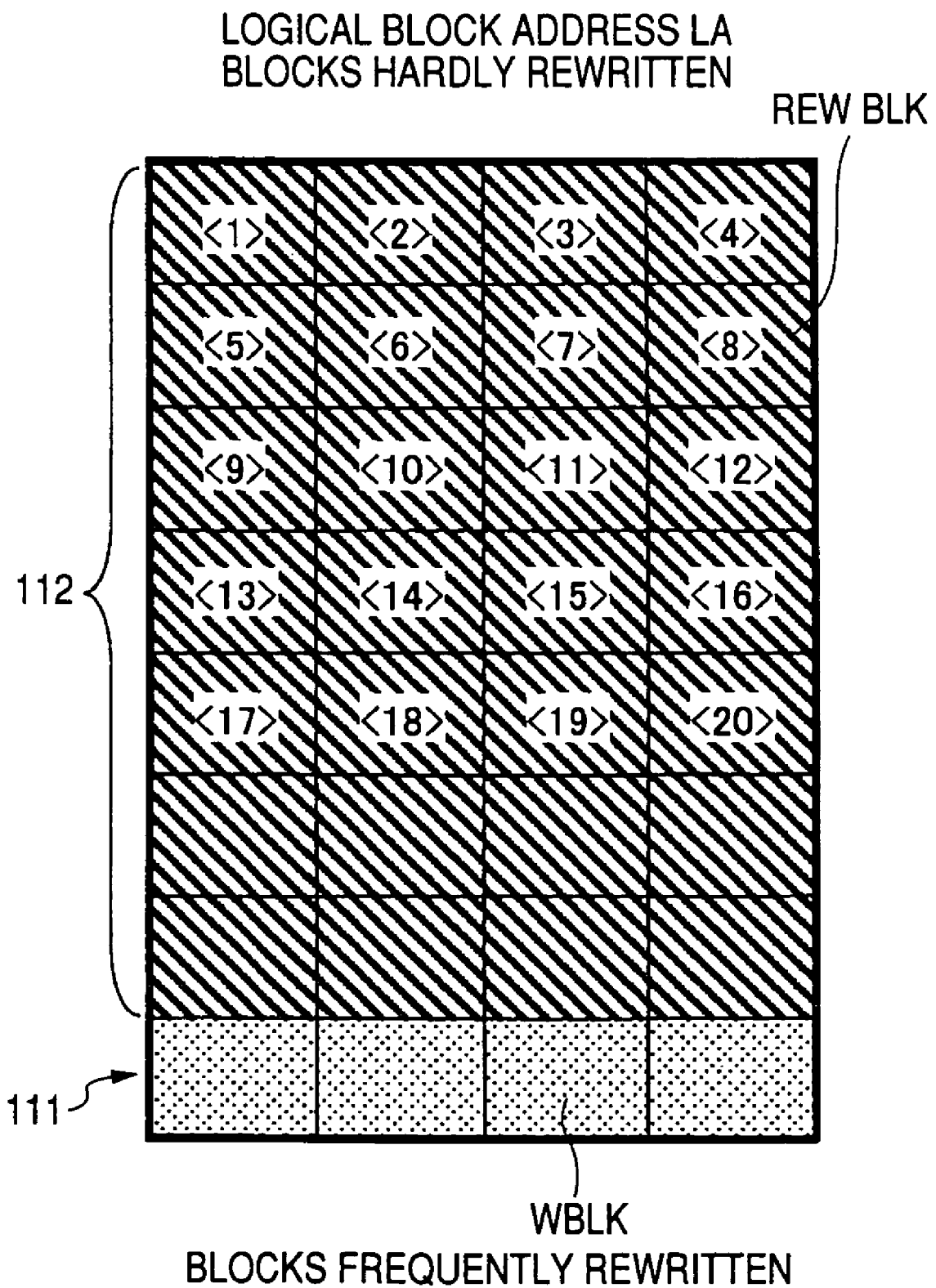
FIG. 6 is a diagram showing an example of a structure of a data area in a NAND flash memory according to the embodiment.

FIG. 6 is a diagram showing an example of a structure of a data area in the NAND flash memory according to this embodiment.

As shown in FIG. 6, the flash memory 11 according to this embodiment has the first data area 111 in which data is frequently rewritten and the second data area 112 in which data is hardly rewritten.

In the example in FIG. 6, most of blocks of a storage capacity of the flash memory 11 are occupied by blocks in which data is hardly rewritten. In FIG. 6, the example is shown using the logical block addresses LA.

Figure 7:
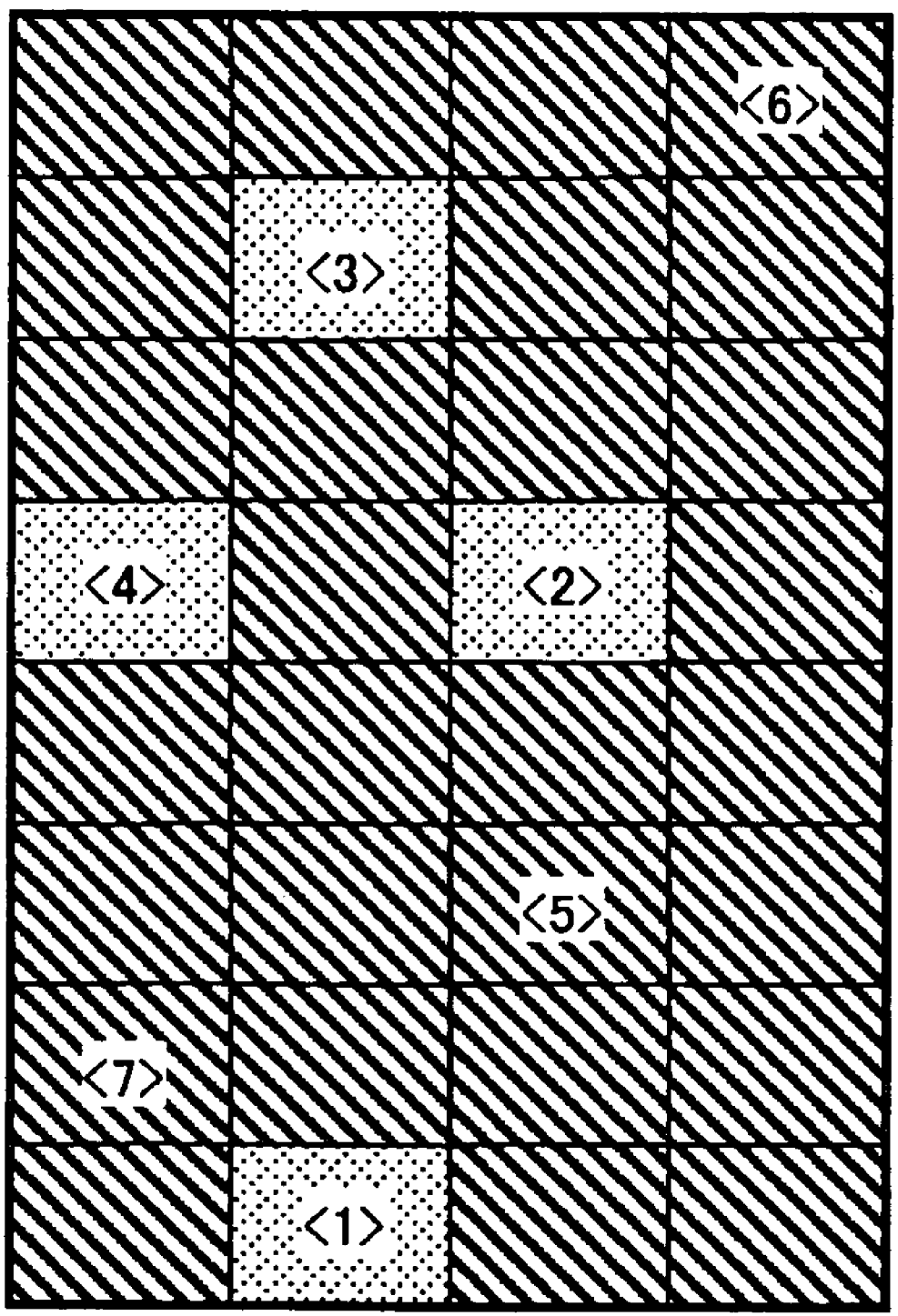
FIG. 7 is a diagram showing an example in which logical block addresses LA in FIG. 6 are converted into physical block addresses PA corresponding thereto.

FIG. 7 is a diagram showing an example in which the logical block addresses LA in FIG. 6 are converted into physical block addresses PA corresponding thereto.

In a state shown in FIG. 7, logical block addresses LA in the second data area 112 in which data is hardly rewritten are sequentially selected and physical block addresses PA at new rewriting destinations in the first data area 111 in which data is frequently rewritten are updated to physical block addresses PA corresponding to the logical block addresses LA.

After data stored in the logical block addresses LA in the second data area 112 in which data is hardly rewritten are copied to an erased block, the NAND flash memory 11 according to this embodiment is controlled to erase a block at a copy source and managed.

In the NAND flash memory 11 according to this embodiment, flags are provided in any one of the logical block addresses LA2 in the second data area 112 having stored therein data hardly rewritten and the logical block addresses LA1 in the first area 111 having stored therein data frequently rewritten or both to make the logical block addresses LA1 and the logical block addresses LA1 identifiable.

Figure 8:
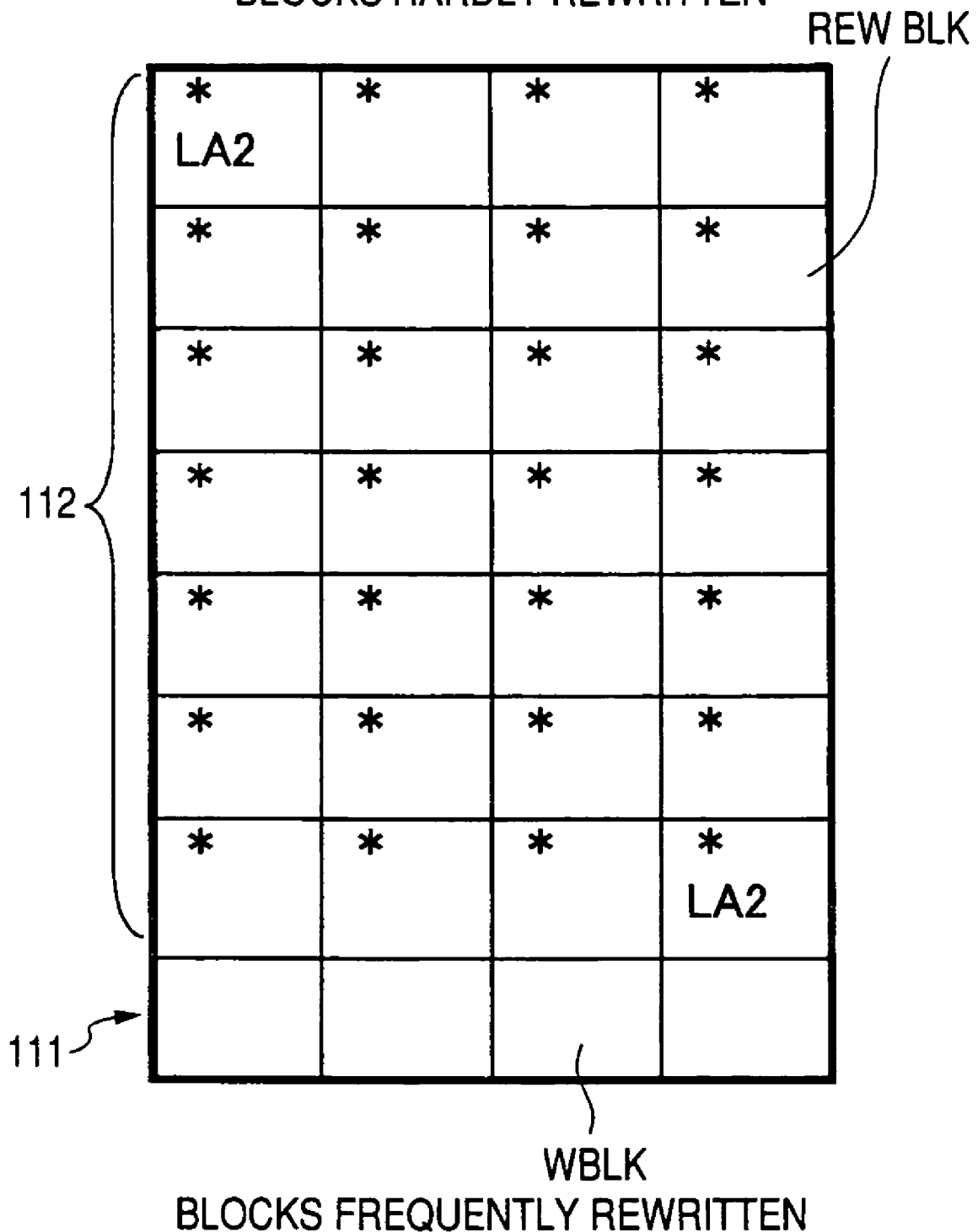
FIG. 8 is a diagram showing an example in which flags * are provided in logical block addresses LA2 having stored therein data hardly rewritten.
Figure 10:
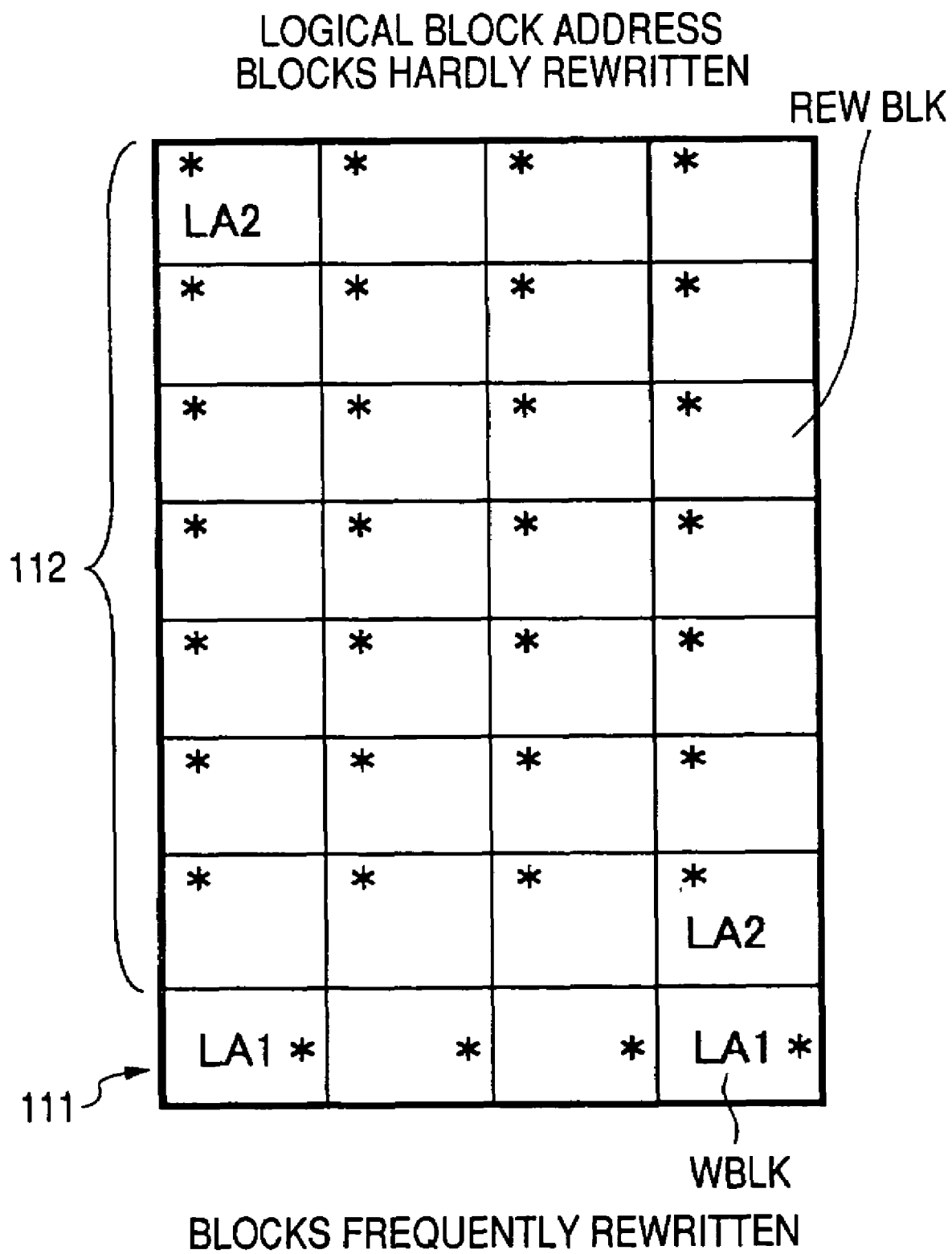
FIG. 10 is a diagram showing an example in which the flags * are provided in the logical block addresses LA2 having stored therein data hardly rewritten and the logical block addresses LA1 having stored therein data frequently rewritten.

FIG. 8 shows an example in which flags * are provided in the logical block addresses LA2 having stored therein data hardly rewritten. FIG. 9 shows an example in which the flags * are provided in the logical block addresses LA1 having stored therein data frequently rewritten. FIG. 10 shows an example in which the flags * are provided in both the logical block addresses LA2 and the logical block addresses LA1.

In the NAND flash memory 11 according to this embodiment, after logical block addresses are erased, the erased logical block addresses are immediately written in erased blocks and blocks to be rewritten are sequentially rewritten in accordance with the erased logical block addresses. The numbers of times of rewriting of physical blocks are averaged to prevent rewriting from being concentrated in a specific block and only the number of times of rewriting of the specific physical block from increasing.

Figure 11:
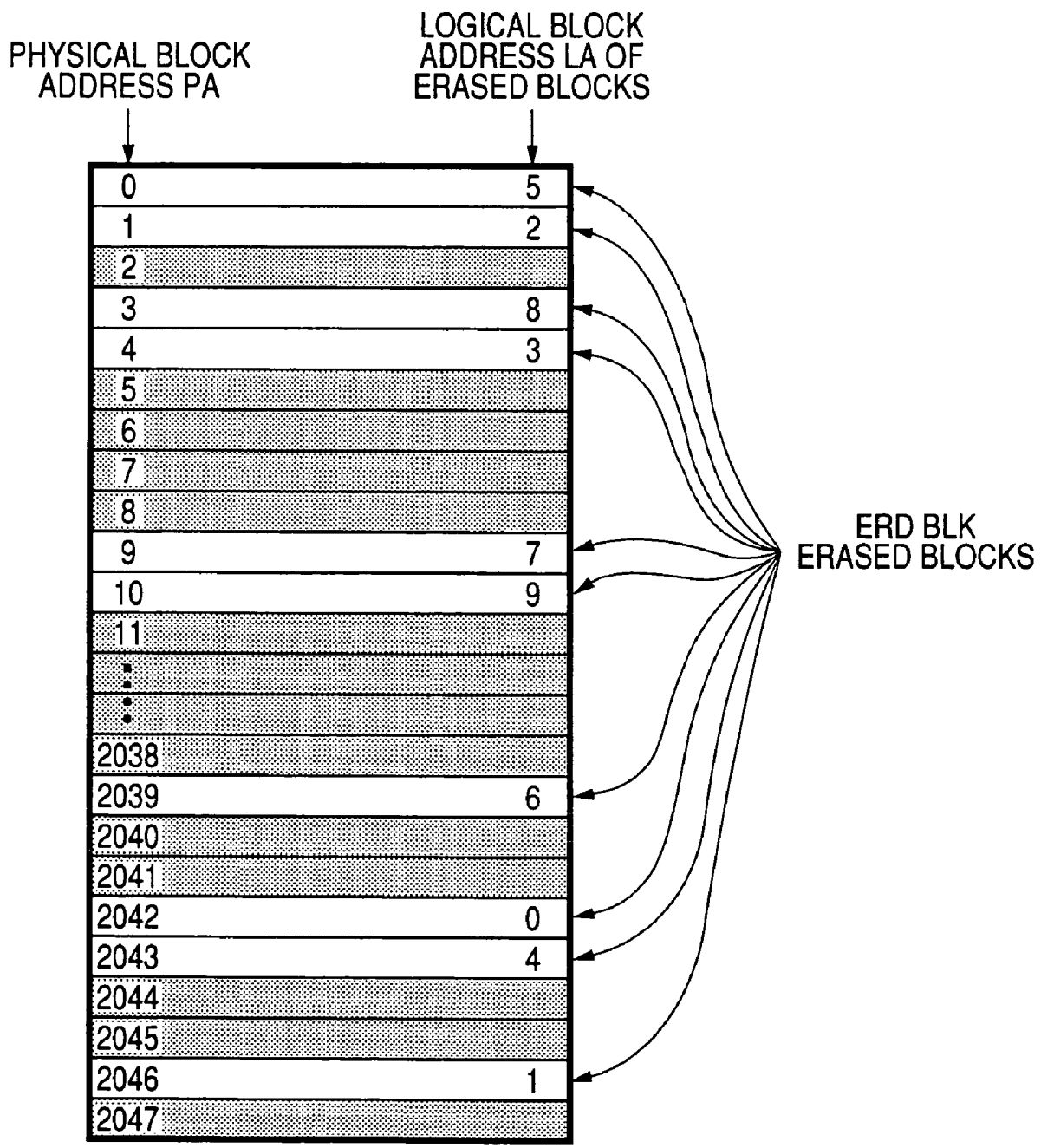
FIG. 11 is a diagram showing an example in which physical blocks are sequentially rewritten in accordance with erased logical block addresses to average the numbers of times of rewriting to prevent rewriting from being concentrated in a specific physical block and prevent only the number of times of writing of the specific physical block from increasing.

FIG. 11 shows an example in which, after logical block addresses are erased, the erased logical block addresses are immediately written in erased blocks, blocks to be rewritten are sequentially rewritten in accordance with the erased logical block addresses such that the numbers of times of rewriting of physical blocks are averaged to prevent rewriting from being concentrated in a specific physical block and prevent only the number of times of rewriting of the specific physical block from increasing.

FIG. 11 shows a block and page arrangement of a binary 2-Gbit NAND flash memory.

As shown in FIG. 11, a 2-Gbit chip includes 2048 blocks BLK of 128 KB and is constituted by 2 Gb=256 MB=128 KB×2048. Each of blocks BLK0 to BLK2047 includes 64 pages of 2 KB and is constituted by 128 KB=2 KB×64.

A specific example of the structure of the NAND flash memory 11 that has the first data area 111 and the second data area 112 as data areas and is accessed under the control by the control unit 13 will be explained.

Figure 12:
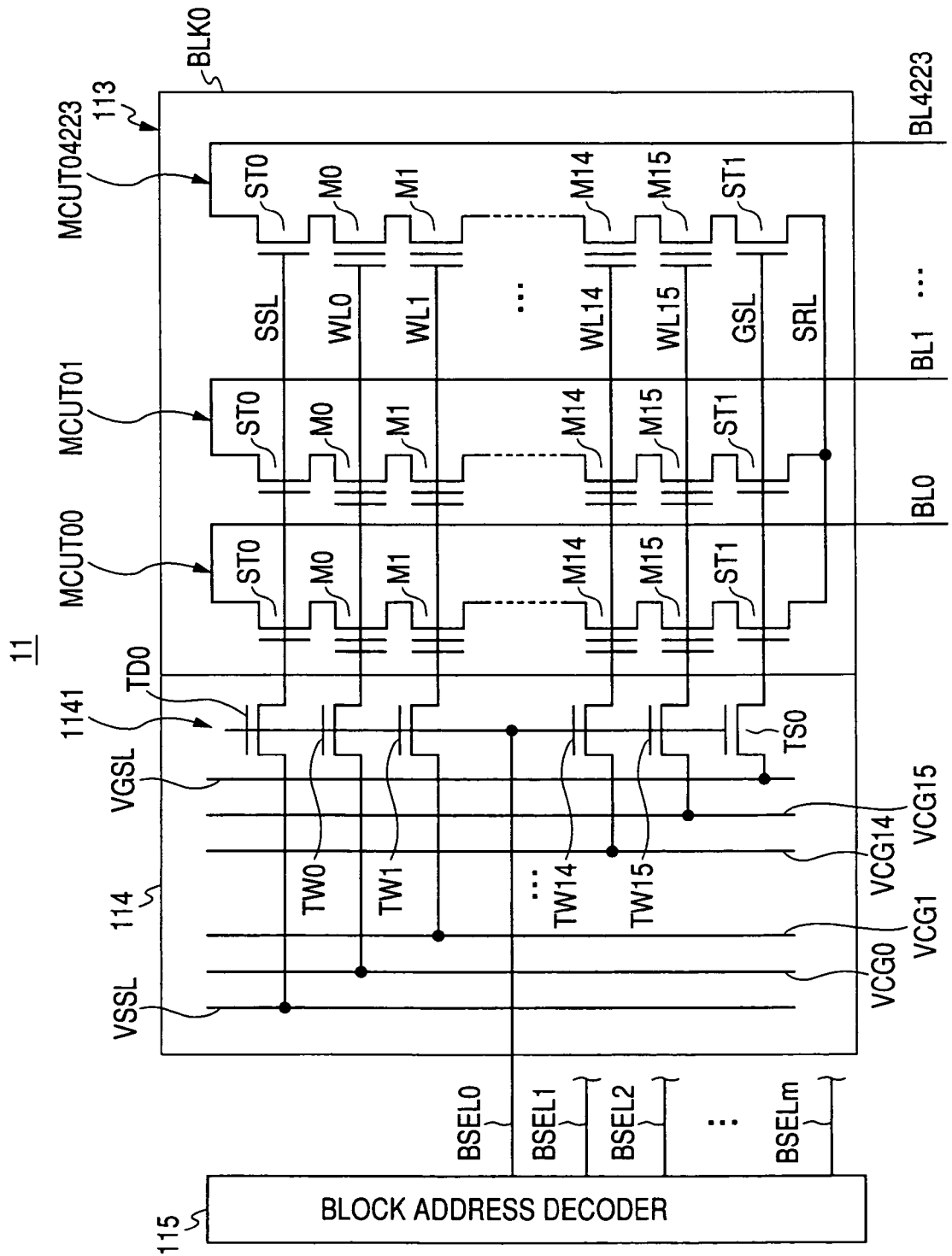
FIG. 12 is a diagram showing a memory cell array and a row decoder in one block of the NAND flash memory according to the embodiment.

FIG. 12 is a diagram showing a memory array and a row decoder in one block of the NAND flash memory according to this embodiment.

In a memory cell array 113, as shown in FIG. 12, memory cell units MCUT00, MCUT01, and MCUT04223 each constituted by plural, for example, sixteen memory cell transistors M0 to M15 connected in series and two selection gate transistors ST0 and ST1 connected in series at both ends of the memory cell transistors M0 to M15 are arranged in a matrix shape.

In FIG. 12, for simplification of the drawing, only a block BLK0 in one row in which 4224 memory cell units MCUT00 to MCUT04223 in 4224 columns per row are arrayed is shown. However, actually, plural (m) blocks BLK1 to BLKm having the same structure as the block BLK0 are further arrayed.

In the example in FIG. 12, the number of bit lines is set to 528 bytes obtained by adding reserve 16 bytes to usual 512 bytes, that is, 4224 lines.

The selection gate transistor ST0 connected to a drain of the memory cell transistor M0 of the memory cell unit MCUT00 is connected to a bit line BL0. A drain of the memory cell transistor M0 of the memory cell unit MCUT01 is connected to a bit line BL1. Similarly, a drain of the memory cell transistor M0 of the memory cell unit MCUT04223 is connected to a bit line BL4223.

The selection gate transistors ST1, to which sources of the memory cell transistors M15 of the respective memory cell units MCUT00 to 04223 are connected, are connected to a common source line SRL.

Gate electrode of memory cell transistors of the memory cell units MCUT00 and MCUT01 to MCUT04223 arranged in an identical row are connected to common word lines WL0 to WL15. Gate electrodes of the selection gate transistors ST0 are connected to a common selection gate line DSG. Gate electrodes of the selection gate transistors ST1 are connected to a common selection gate line SSG.

A row decoder 114 has a transfer gate group 1141, a conduction state of which is controlled by a block address decoder 115, word lines supplied from a not-shown word line decoder, and driving voltage supply lines for selection gate lines VCG0 to VCG15, VDSG, and VSSG.

In FIG. 12, for simplification of the drawing, a block address decoder section and a transfer gate group corresponding to the block BLK0 are shown. However, actually, block address decoder sections and transfer gate groups are provided in association with not-shown plural blocks arrayed.

The row decoder 114 has a function of selecting a word line (a control gate line). The row decoder 114 supplies, in response to a control signal indicating an operation of read, write (program), or erase, a driving voltage equal to or lower than a power supply voltage Vcc boosted or not boosted by a not-shown booster according to an operation from an address held in an address register to the driving voltage supply lines VCG0 to VCG15, VDSG, and VSSG.

The transfer gate group 1141 is constituted by transfer gates TW0 to TW15, TD0, and TS0.

The transfer gate group 1141 is kept in a conduction state by a signal BSEL generated in response to a block address decoded by the block address decoder 115 and used for driving a selection gate line and a word line of a block corresponding to the block address.

Specifically, when the block BLK0 is addressed, the respective transfer gates TW0 to TW15 operatively connect the word lines WL0 to WL15 and the driving voltage supply lines VCG0 to VCG15 in response to an output signal BSEL0 of the block address decoder 115. The transfer gates TD0 and TS0 operatively connect the selection gate lines DSG and SSG and the driving voltage supply line VDSG and VSSG in response to the output signal BSEL0 of the block address decoder 115 in the same manner.

The block address decoder 115 decodes a block address from an address held in the not-shown address register and keeps a transfer gate group 2221 for driving, in response to the block address decoded, a selection gate line and a word line of a block of the row decoder 114 corresponding to the block address decoded in a conduction state according to the signal BSEL.

The page buffer 12 in FIG. 5 latches read data from the memory cell array 113 of the flash memory 11 or write data into the memory cell array 113 in page units.

System selection for the Passive-wear-leveling control and the Active-wear-leveling control or condition setting values of both the kinds of Wear-leveling are stored in a first page of the flash memory 11 and automatically read out to the page buffer 12 when a power supply is turned on.

In the memory system 10 according to this embodiment, the control unit 13 performs, in performing Wear-leveling control for preventing rewriting from being concentrated in a specific physical address block, the Passive-wear-leveling control for leaving a physical address block not rewritten as it is and the Active-wear-leveling control for rewriting even a physical address block not rewritten such that the numbers of times of rewriting of all physical address blocks are averaged.

System selection for the Passive-wear-leveling control and the Active-wear-leveling control or condition setting values of both the kinds of Wear-leveling are stored in the flash memory 11 such that a user can freely perform system selection and condition setting for both the Wear-leveling controls.

System selection for the Passive-wear-leveling control and the Active-wear-leveling control or condition setting values of both the kinds of Wear-leveling are stored in the first page of the flash memory 11 and automatically read out to the page buffer 12 when the power supply is turned on.

In applying the Wear-leveling control for preventing rewriting from being concentrated in a specific physical address block to the flash memory 11, when data not frequently rewritten is stored in more than half blocks of the flush memory 11, the control unit 13 selects the Active-wear-leveling control system.

On the other hand, when data frequently rewritten is stored in more than half blocks of the flash memory 11, the control unit 13 selects the Passive-wear-leveling control system.

Figure 13:
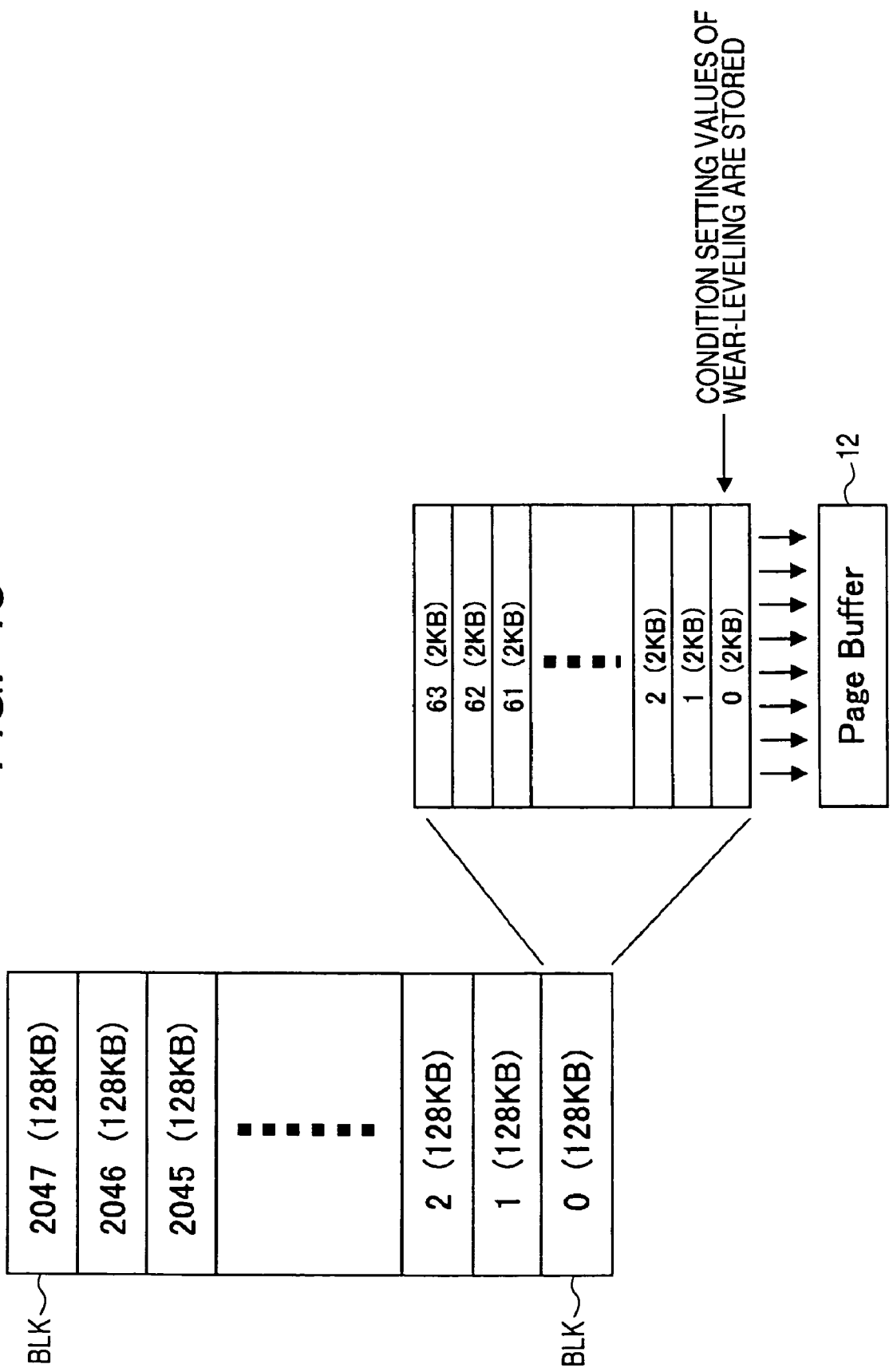
FIG. 13 is a diagram showing an example in which condition setting values of Active-wear leveling and Passive-wear leveling are stored in the NAND flash memory.

FIG. 13 is a diagram showing an example in which condition setting values of Active-wear leveling and Passive-wear leveling are stored in the NAND flash memory.

For example, condition setting values of the Active-wear leveling and the Passive-wear leveling are stored in the NAND flash memory 11 such that, when data not frequently rewritten is stored in more than half blocks of the NAND flash memory 11, the Active-wear-leveling control system is selected and, on the other hand, when data frequently rewritten is stored in more than half blocks of the NAND flash memory 11, the Passive-wear-leveling control system is selected.

In the example shown in FIG. 13, system selection for the Passive-wear-leveling control and the Active-wear-leveling control or condition setting values of both the kinds of Wear-leveling are stored in the first page of the NAND flash memory and automatically read out to the page buffer 13 when the power supply is turned on.

A Wear-leveling control operation in the control unit 13 will be explained.

Active-wear leveling performed every time data is rewritten in the first data area 111, Active-wear leveling performed once in N times when data is rewritten in the first data area 111, and Active-wear leveling performed according to a host command when data is rewritten in the first data area 111 will be explained as examples in order.

First, Active-wear leveling performed every time data is rewritten in the first data area 111 will be explained.

Figure 14:
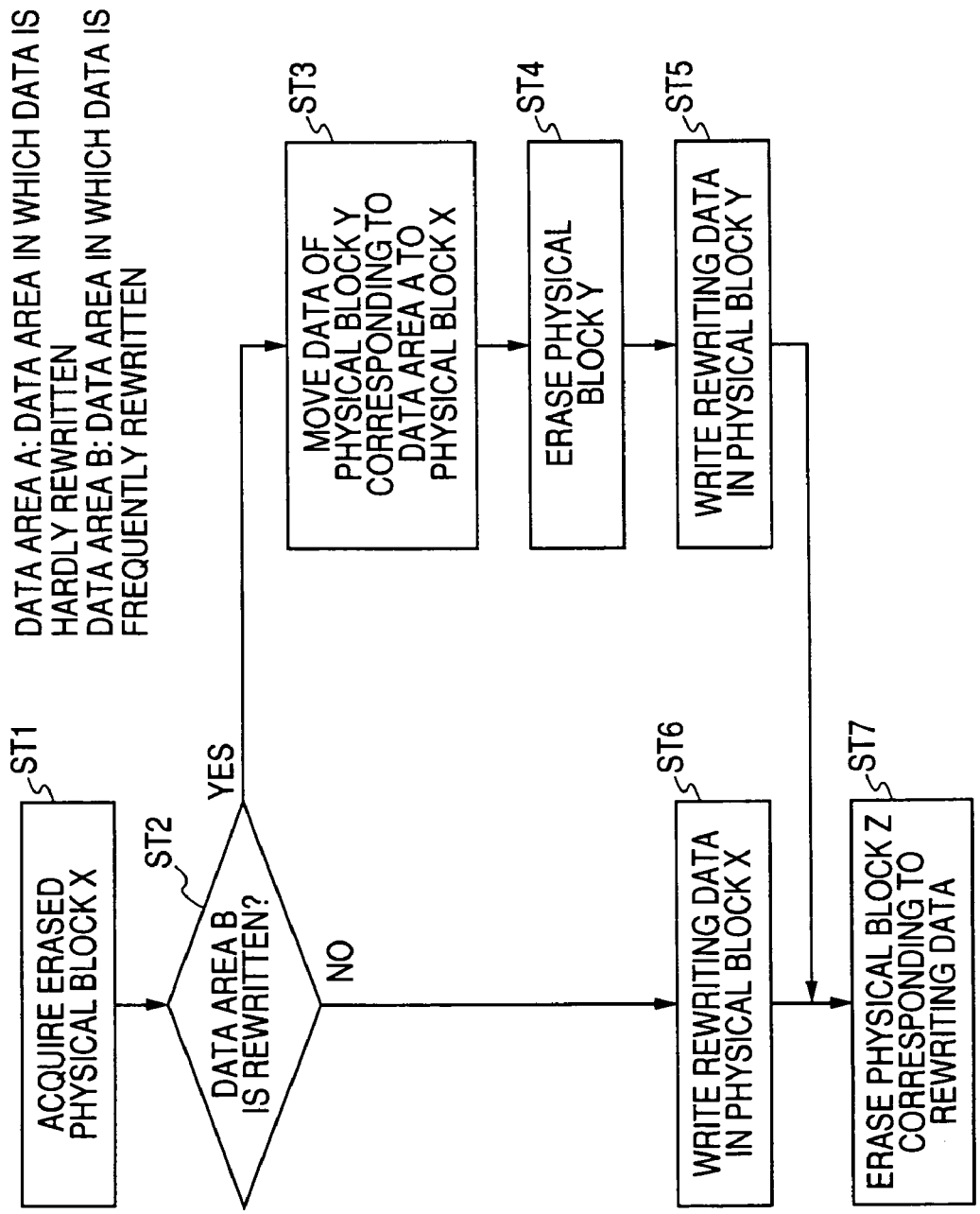
FIG. 14 is a flowchart for explaining Active-wear leveling performed every time a logical block in a first data area is rewritten.

FIG. 14 is a flowchart for explaining Active-wear leveling performed every time data is rewritten in the first data area 111.

In the following explanation, the first data area 111 is referred to as a data area B and the second data area 112 is referred to as data area A.

In this case, the control unit 13 acquires an erased physical block X (ST1) and judges whether data is rewritten in the data area B (the first data area 111) (ST2).

When it is judged in step ST2 that an area in which data should be rewritten is the data area B (the first data area 111), the control unit 13 moves data of a physical block Y corresponding to the data area A (the second data area 112) to the erased physical block X (ST3).

Subsequently, the control unit 13 erases the physical block Y (ST4) and writes rewriting data in the physical block Y (ST5).

On the other hand, when it is judged in step ST2 that an area in which data should be rewritten is not the data area B (the first data area 111), the control unit 13 writes rewriting data in the physical block X (ST6).

After the processing in step ST5 or step ST6, the control unit 13 erases a physical block Z corresponding to the rewriting data (ST7).

Figure 15:
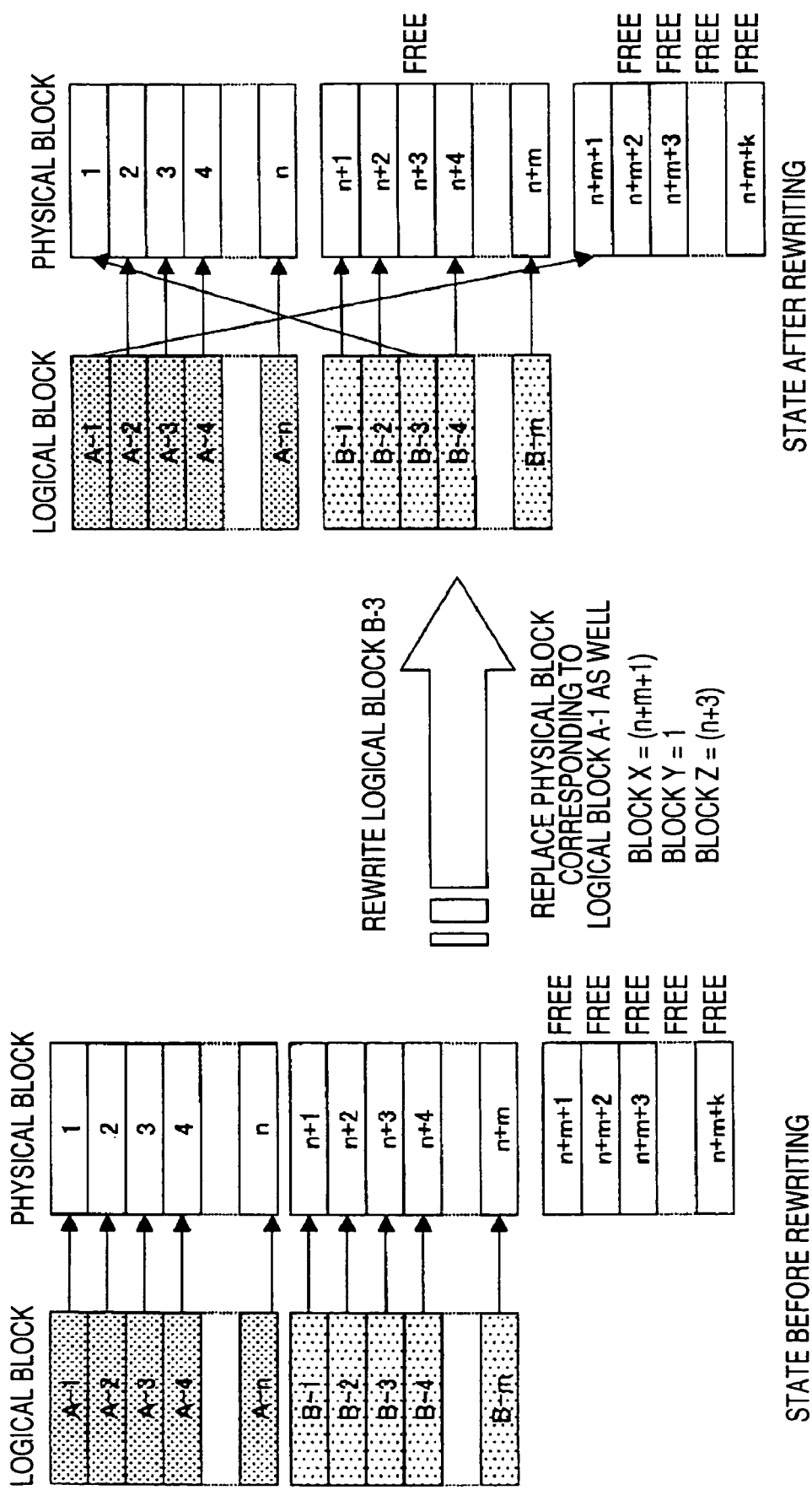
FIG. 15 is a diagram showing states before and after rewriting at the time when a logical block B-3 in a first data area B(111) is rewritten in a processing flow in FIG. 14.

FIG. 15 is a diagram showing states before and after the logical block B-3 in the first data area B (111) is rewritten in the processing flow in FIG. 14.

In an example in FIG. 15, the first data area B (111) includes logical blocks B-1 to B-m and the second data area A (112) includes logical blocks A-1 to A-n.

The logical blocks A-1 to A-n in the second data area A (112) correspond to physical blocks 1 to n, the logical blocks B-1 to B-m in the first data area B (111) correspond to physical blocks (n+1) to (n+m), and free spaces are physical blocks (n+m+1) to (n+m+k).

In rewriting the logical block B-3 in the first data area B (111) from this state, i.e., before rewriting is performed, a physical block corresponding to the logical block A-1 in the second data area A (112) is replaced as well.

In a state after rewriting has been performed in this example, the erased physical block X is (n+m+1), a physical block in the second data area A (112) is 1, the physical block Z corresponding to the rewriting data is (n+3), and this physical block (n+3) is a free space.

Figure 16:
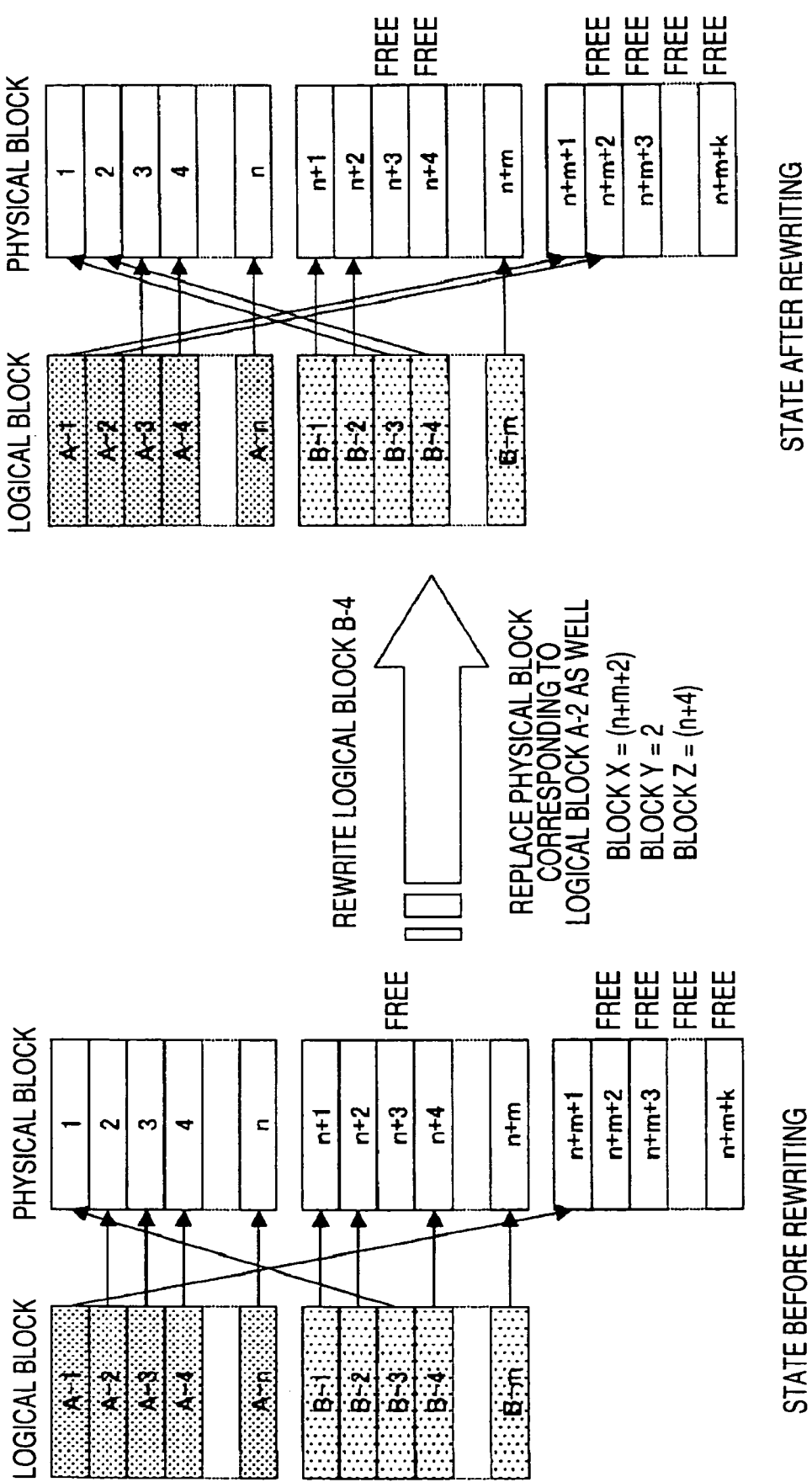
FIG. 16 is a diagram showing states before and after rewriting at the time when a logical block B-4 is rewritten after the logical block B-3 in the first data area B(111) is rewritten as shown in FIG. 15.

FIG. 16 is a diagram showing states before is performed and after rewriting has been performed in the case in which a logical block B-4 is rewritten after the logical block B-3 in the first data area B (111) is rewritten as shown in FIG. 15 in the processing flow in FIG. 14.

In rewriting the logical block B-4 in the first data area B (111) from a state before rewriting after the rewriting in FIG. 15, a physical block corresponding to the logical block A-2 in the second data area A (112) is replaced as well.

In a state after rewriting in this example, the erased physical block X is (n+m+2), a physical block in the second data area A (112) is 2, the physical block Z corresponding to the rewriting data is (n+4), and this physical block (n+4) is a free space.

Active-wear leveling performed once in N times when rewriting in the first data area 111 is performed will be explained.

Figure 17:
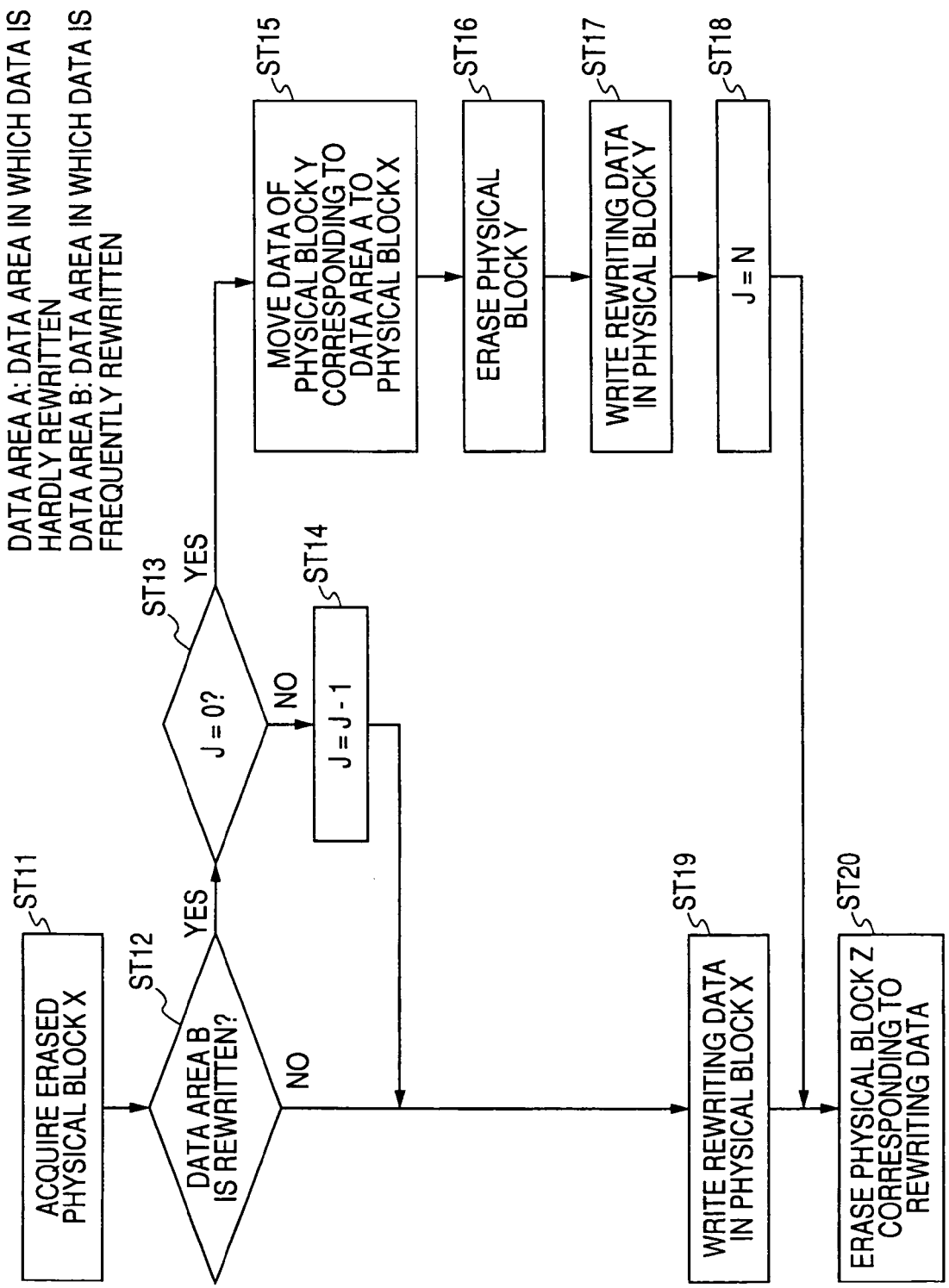
FIG. 17 is a flowchart for explaining Active-wear leveling performed once in N times when a logical block in the first data area is rewritten.

FIG. 17 is a flowchart for explaining Active-wear leveling performed once in N times when rewriting in the first data area 111 is performed.

In this case, the control unit 13 acquires the erased physical block X (ST11) and judges whether data is rewritten in the data area B (the first data area 111) (ST12).

When it is judged in step ST12 that an area in which data should be rewritten is the data area B (the first data area 111), the control unit 13 judges whether a predetermined number J has reached 0 (ST13).

When it is judged in step ST13 that J has not reached 0, the control unit 13 decrement 1 from J and shifts to the next processing (ST14).

When it is judged in step ST13 that J has reached 0, the control unit 13 moves data of the physical block Y corresponding to the data area A (the second data area 112) to the erased physical block X (ST15).

Subsequently, the control unit 13 erases the physical block Y (ST16) and writes rewriting data in the physical block Y (ST17). Then, the control unit 13 sets J to N (ST18) On the other hand, when it is judged in step ST12 that an area in which data should be rewritten is not the data area B (the first data area 111) or when 1 is decremented from J in step ST14, the control unit 13 writes the rewriting data in the physical block X (ST19).

After the processing in step ST18 or step ST19, the control unit 13 erases the physical block Z corresponding to the rewiring data (ST20).

Active-wear leveling performed according to a host command at the time of rewriting will be explained.

Figure 18:
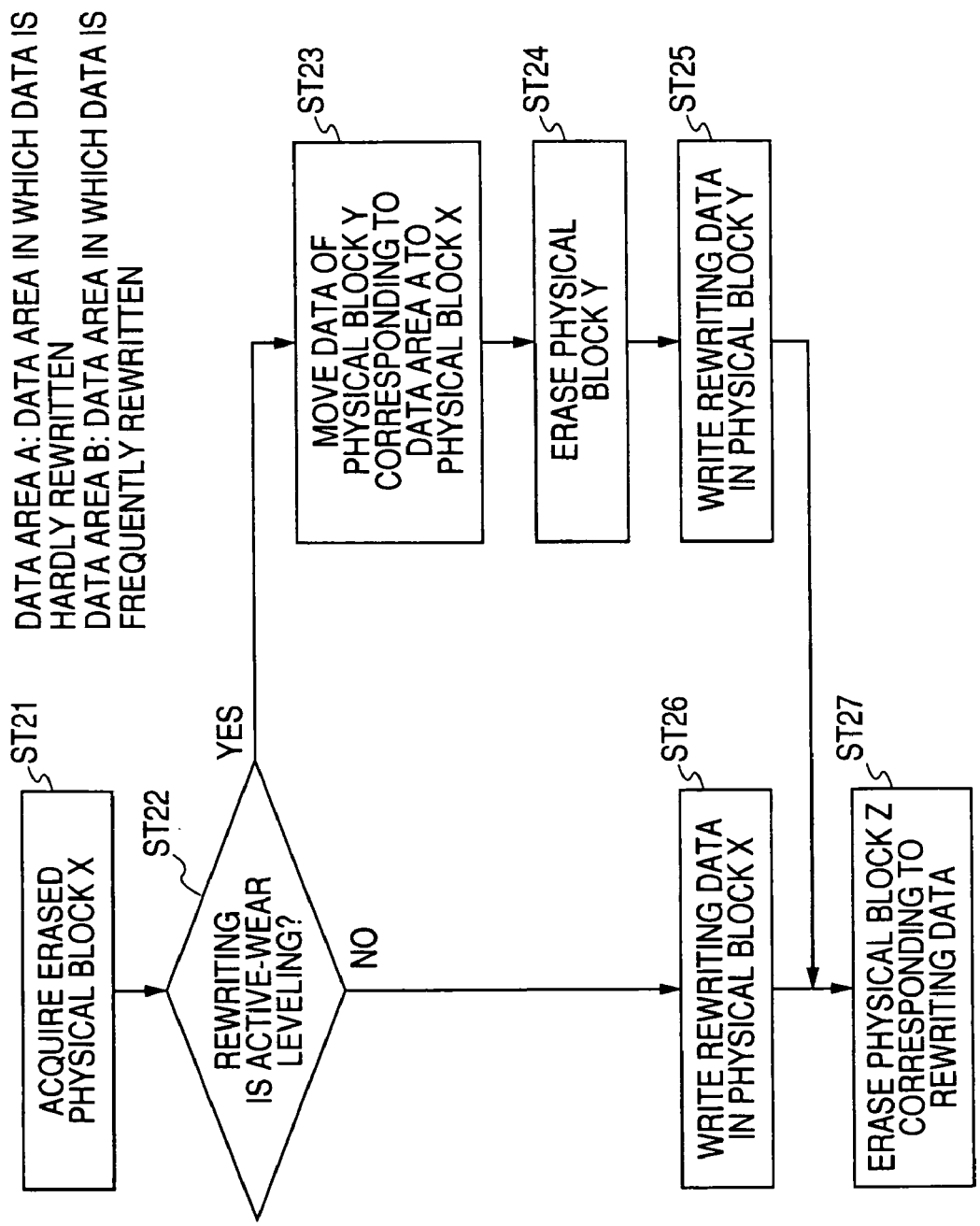
FIG. 18 is a flowchart for explaining Active-wear leveling performed according to a host command when a logical block is rewritten.

FIG. 18 is a flowchart for explaining Active-wear leveling performed according to a host command at the time of rewriting.

In this case, the control unit 13 acquires the erased physical block X (ST21) and judges whether data rewriting is Active-wear leveling (ST22).

When it is judged in step ST22 that data rewriting is Active-wear leveling, the control unit 13 moves data of the physical block Y corresponding to the data area A (the second data area 112) to the erased physical block X (ST23).

The control unit 13 erases the physical block Y (ST24) and writes rewriting data in the physical block Y (ST25).

On the other hand, when it is judged in step ST22 that data rewriting is not Active-wear leveling, the control unit 13 writes the rewriting data in the physical block X (ST26) After the processing in step ST25 or step ST26, the control unit 13 erases the physical block Z corresponding to the rewriting data (ST27).

As explained above, according to this embodiment, the memory system has the flash memory 11 that includes a first data area in which data is frequently rewritten and a second data area in which data is hardly rewritten and the control unit 13 that sequentially selects logical block addresses in the second data area in which data is hardly rewritten and updates physical block addresses at new rewriting destinations in the first data area in which data is frequently rewritten to physical block addresses corresponding to the logical block addresses selected. The control unit 13 is capable of performing, in performing Wear-leveling control for preventing rewriting from being concentrated in a specific physical address block, Passive-wear-leveling control for leaving a physical address block not rewritten as it is and Active-wear-leveling control for rewriting even a physical address block not rewritten such that the numbers of times of rewriting of all physical address blocks are averaged. System selection for the Passive-wear-leveling control and the Active-wear-leveling control or condition setting values of both the kinds of Wear-leveling are stored in the flash memory 11. Thus, it is possible to obtain effects described below.

There are advantages that, in a memory system including a nonvolatile semiconductor storage device, it is possible to substantially improve a Wear-leveling control system, it is possible to typically perform optimum Wear-leveling control even when data having a data area in which data is frequently rewritten and a data area in which data is hardly rewritten mixed therein is stored, and it is possible to substantially improve an effective life in terms of the number of times of rewriting by the memory system in which the nonvolatile semiconductor storage device is used.

Since the number of times of rewriting of the memory system is increased, it goes without saying that a more reliable system can be provided. Moreover, the extension of the life in terms of the number of times of rewriting leads to a reduction in cost of the system.

It should be understood by those skilled in the art that various modifications, combinations, sub-combinations, and alterations may occur depending on design requirements and the other factors insofar as they are within the scope of the appended claims or the equivalents thereof.

What is claimed is:

1. A memory system including a nonvolatile semiconductor storage device, comprising:
   a nonvolatile memory unit that includes a first data area in which data is frequently rewritten and a second data area in which data is hardly rewritten; and
   a control unit, wherein
   the control unit sequentially selects logical block addresses in the second data area in which data is hardly rewritten and updates physical block addresses at new rewriting destinations in the first data area in which data is frequently rewritten to physical block addresses corresponding to the logical block addresses selected;
   wherein the control unit immediately writes, after erasing a logical block address, the erased logical block address in an erased block and sequentially rewrites blocks to be rewritten in accordance with the erased logical block address.

2. A memory system according to claim 1, wherein the control unit copies data stored in the logical block addresses in the second data area in which data is hardly rewritten to an erased block and, then, erases a block at a copy source.

3. A memory system according to claim 2, wherein the control unit provides identification flags in at least one of the logical block addresses that store data hardly rewritten and the logical block addresses that store data frequently rewritten.

4. A memory system including a nonvolatile semiconductor storage device, comprising:
   a nonvolatile memory unit that includes a first data area in which data is frequently rewritten and a second data area in which data is hardly rewritten; and
   a control unit that sequentially selects logical block addresses in the second data area in which data is hardly rewritten and updates physical block addresses at new rewriting destinations in the first data area in which data is frequently rewritten to physical block addresses corresponding to the logical block addresses selected, wherein
   the control unit is capable of performing, in performing Wear-leveling control for preventing rewriting from being concentrated in a specific physical address block, Passive-wear-leveling control for leaving a physical address block not rewritten as it is and Active-wear-leveling control for rewriting even a physical address block not rewritten such that the numbers of times of rewriting of all physical address blocks are averaged, and
   system selection for the Passive-wear-leveling control and the Active-wear-leveling control or condition setting values of both the kinds of Wear-leveling are stored in the nonvolatile memory unit;
   wherein the control unit selects, when data not frequently rewritten is stored in more than half blocks of the nonvolatile memory unit, the Active-wear-leveling control system and selects, when data frequently rewritten is stored in more than half blocks of the nonvolatile memory unit, the Passive-wear-leveling control system.

5. A memory system according to claim 4, further comprising a page buffer, wherein
   the system selection for the Passive-wear-leveling control and the Active-wear-leveling control or the condition setting values of both the kinds of Wear-leveling are stored in a first page of the nonvolatile memory unit and automatically read out to the page buffer when a power supply is turned on.

6. A memory system according to claim 5, wherein it is possible to arbitrarily set the system selection for the Passive-wear-leveling control and the Active-wear-leveling control and the condition setting values of both the kinds of Wear-leveling.

7. A memory system according to claim 4, wherein it is possible to arbitrarily set the system selection for the Passive-wear-leveling control and the Active-wear-leveling control and the condition setting values of both the kinds of Wear-leveling.

8. A memory system according to claim 4, wherein the control unit copies data stored in the logical block addresses in the second data area in which data is hardly rewritten to an erased block and, then, erases a block at a copy source.

9. A memory system according to claim 8, wherein the control unit provides identification flags in at least one of the logical block addresses that store data hardly rewritten and the logical block addresses that store the data frequently rewritten.

10. A memory system according to claim 4, wherein the nonvolatile semiconductor storage device includes a NAND flash memory in which plural rewritable nonvolatile memory cells are connected in series.

11. A memory system including a nonvolatile semiconductor storage device, comprising:
    a nonvolatile memory unit that includes a first data area in which data is frequently rewritten and a second data area in which data is hardly rewritten; and
    a control unit that sequentially selects logical block addresses in the second data area in which data is hardly rewritten and updates physical block addresses at new rewriting destinations in the first data area in which data is frequently rewritten to physical block addresses corresponding to the logical block addresses selected, wherein
    the control unit is capable of performing, in performing Wear-leveling control for preventing rewriting from being concentrated in a specific physical address block, Passive-wear-leveling control for leaving a physical address block not rewritten as it is and Active-wear-leveling control for rewriting even a physical address block not rewritten such that the numbers of times of rewriting of all physical address blocks are averaged, and
    system selection for the Passive-wear-leveling control and the Active-wear-leveling control or condition setting values of both the kinds of Wear-leveling are stored in the nonvolatile memory unit; and wherein the control unit immediately writes, after erasing a logical block address, the erased logical block address in the erased block and sequentially rewrites blocks to be rewritten in accordance with the erased logical block address.

* * * * *